United States Patent [19]

Takasu et al.

[11] Patent Number: 4,847,052
[45] Date of Patent: * Jul. 11, 1989

[54] DEVICE FOR GROWING SINGLE CRYSTALS

[75] Inventors: Shin'ichiro Takasu, Tokyo; Eiichi Toji, Machida; Kazumoto Homma, Sagamihara; Michihiro Ohwa, Kunitachi, all of Japan

[73] Assignee: Toshiba Ceramics Co., Ltd., Tokyo, Japan

[*] Notice: The portion of the term of this patent subsequent to Jul. 11, 2006 has been disclaimed.

[21] Appl. No.: 31,439

[22] Filed: Mar. 26, 1987

[30] Foreign Application Priority Data

Apr. 30, 1986 [JP] Japan .................... 61-100554

[51] Int. Cl.$^4$ ............................................. C30B 15/22
[52] U.S. Cl. .................... 422/249; 156/617.1; 156/618.1; 156/619.1; 156/620.4; 156/DIG. 64
[58] Field of Search ............... 422/249; 156/617 SD, 156/618, 619, DIG. 64, 617.1, 618.1, 619.1, 620.4

[56] References Cited

U.S. PATENT DOCUMENTS

| 3,359,077 | 12/1967 | Arst | 422/249 |
| 4,592,895 | 6/1986 | Matsutani et al. | 422/249 |
| 4,637,854 | 1/1987 | Fukuda et al. | 156/617 SP |
| 4,659,423 | 4/1987 | Kim et al. | 156/618 |

FOREIGN PATENT DOCUMENTS

| 135676 | 3/1985 | European Pat. Off. | 156/617.1 |
| 60-033291 | 2/1985 | Japan | 156/617 SP |
| 60-33297 | 6/1985 | Japan | 156/617.1 |
| 61-222984 | 10/1986 | Japan | 422/249 |
| 61-251594 | 11/1986 | Japan | 156/617 SP |
| 2109267 | 6/1983 | United Kingdom | 156/618 |
| 2144338 | 3/1985 | United Kingdom | 422/249 |

OTHER PUBLICATIONS

Terashima et al., A New Magnetic-Field Applied Pulling Apparatus, Journal of Crystal Growth 63 (1983) pp. 423-425.
Solid State Science and Technology 129, Feb. 1982, pp. 427-429.

Primary Examiner—John Doll
Assistant Examiner—Robert M. Kunemund
Attorney, Agent, or Firm—Ronald I. Eisenstein

[57] ABSTRACT

A device for growing single crystals comprising a pair of electromagnetic coils disposed opposed to each other in a symmetry with respect to a central axis of a crucible at an outer side of a heater, a diameter for said coils being greater than 0.8 times of a diameter for said heater and a distance between said coils being greater than 1.5 times of said diameter for said heater.

4 Claims, 5 Drawing Sheets

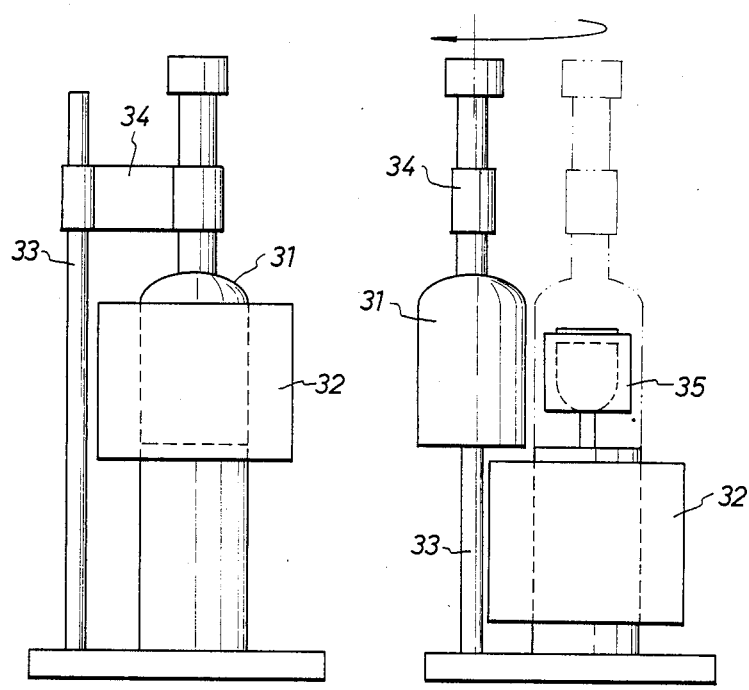

DEVICE FOR GROWING SINGLE CRYSTALS

This invention concerns a device for growing single crystals capable of improving the quality of single crystals by applying a magnetic field to a molten material upon pulling up crystals by Czochralski method from the molten material which is obtained by heating electroconductive substance.

The Czochralski method has been known as a method for producing single crystals such as silicon and the method comprises bringing seed crystals into contact with the surface of molten liquid of polycrystals melted in a crucible, and then growing single crystals by slowly pulling up the seed crystals under rotation. In this case, the molten material undergoes thermal convection due to the heat applied from the side of the molten material and circulated flow such as centrifugal flow of the surface layer of the molten material due to the rotation of the seed crystals. The thermal convection and the circulated flow bring about fluctuations of the temperature at the boundary where the single crystals grow and, as a result, bring about undesirable effects of causing uneven characteristics and defects of crystals to the inside of the thus grown single crystals.

In view of the above, in a case if the molten material is electroconductive substance such as silicon, a parallel magnetic field is applied in the horizontal direction to the molten material thereby causing magnetic viscosity to the material and controlling the circulated flow thereof. As the means for applying the horizontal magnetic field, there have been used cored electromagnets, or coreless coils of opposed cylinder type, opposed disc type or opposed saddle type.

However, heating means for the molten liquid is usually comprises an annular carbon member disposed coaxially with the center axis for the crucible at the outer side thereof and the annular carbon means is alternately disposed with slits from the upper end and slits from the lower end circumferentially, and the electrical heating current flows through the heating means in a zigzag manner along the circumferential direction of the heating means. While on the other hand, the electric current is obtained by rectifying an alternative current. Since such rectified electric current applied to the heating means usually contains 3 to 5% of ripples, repeating stresses are applied to the heating means due to the effect of a magnetic field crossing in perpendicular to the electric current flowing in a zig-zag manner along the circumferential direction of the heating means and varying the current value thereof to shorten the life of the heating means.

In view of the foregoing problem, the object of this invention is to provide a device for growing single crystals, in which the ratios of the diameter for the electromagnetic coils and the distance between the electromagnetic coils relative to the diameter for the cylindrical heating means are respectively within preferred ranges for improving the life of the heating means for the molten material.

The foregoing object of this invention can be attained by a device for growing single crystals comprising a cylindrical crucible, an annular electric heating means disposed coaxially with a central axis of said crucible at an outer side of said crucible for heating and melting an electroconductive substance in said crucible, said heating means being adapted such that electric current flows through said heating means in a zig-zag manner along a circumferential direction of said heating means, and a pair of electromagnetic coils disposed opposed with each other in a symmetry with respect to said central axis of said crucible at an outer side of said heating means, situated substantially at the same height at rotating axes thereof as a liquid surface of said substance melted in said crucible, a diameter for said coils being greater than 0.8 times of a diameter for said heating means and a distance between said coils being greater than 1.5 times of said diameter for said heating means.

According to the device of this invention, since the ratios of the diameter for electromagnetic coils and the distance between the electromagnetic coils relative to the diameter for the cylindrical heating means are respectively within preferred ranges, the life of the heating means for the molten material can be extended.

FIGS. 6A and 6B are explanatory view for the device of growing single crystals equipped with an elevatable low temperature retaining means.

FIGS. 1A and 1B are, respectively, a plan view and a vertical cross sectional view illustrating the flow of the molten material and the magnetic field in the device according to this invention, and the principle of the method and the device according to this invention will now be explained referring to these figures.

Figure 1A:
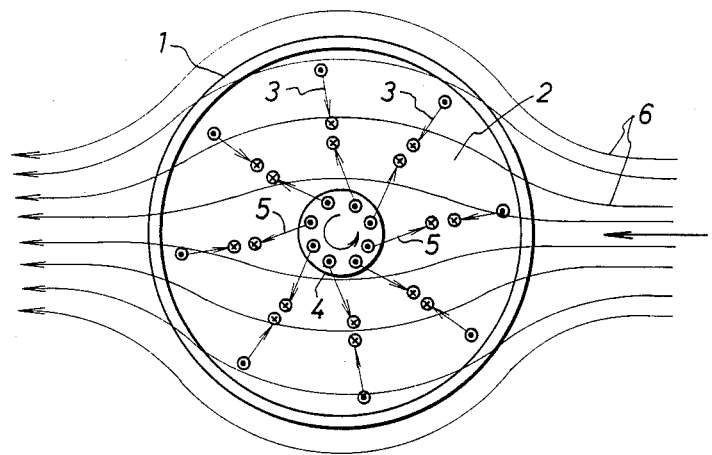
FIG. 1A is a plan view showing the flow of the molten material and the magnetic field in the device according to this invention.
Figure 1B:
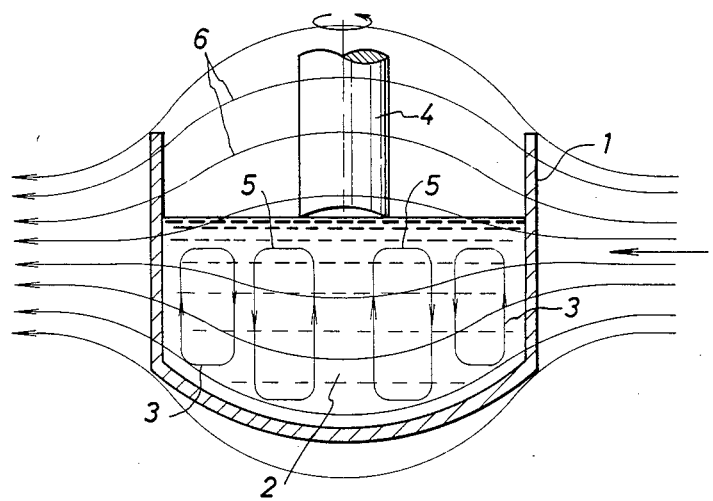
FIG. 1B is a vertical cross sectional view of FIG. 1A.

Since molten material 2 filled in a cylindrical crucible 1 is usually heated from the side of the crucible 1, the temperature at the outer side of the molten material 2 is higher than the temperature at the central region of the material 2, and convection 3 result to the outer circumference of the molten material 2 as shown in FIGS. 1A and 1B. While on the other hand, the surface layer of the molten material 2 is rotated following after the rotation of silicon single crystals 4, which causes circulated flow 5 due to the centrifugal flow of the surface layer and the upward flow at the center of the molten material. In the device according to this invention, magnetic fluxes 6 are applied substantially along the outer circumference and the bottom of the crucible 1, by which the magnetic fluxes 6 intersect the convection 3 and the circulated flow 5 substantially in perpendicular thereto over the wide range region of the molten material 2 to effectively suppress the flow of the molten material 2.

Figure 2:
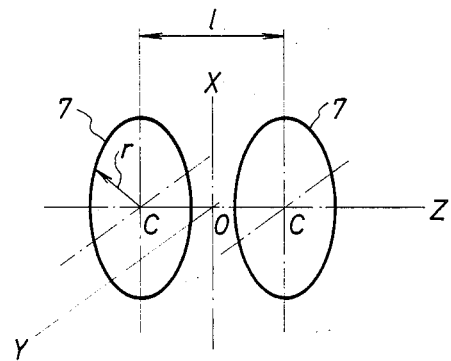
FIG. 2 is an explanatory view illustrating the relationship between the radius of coils for applying a magnetic field to the molten material and the gaps between the opposed coils.
Figure 3:
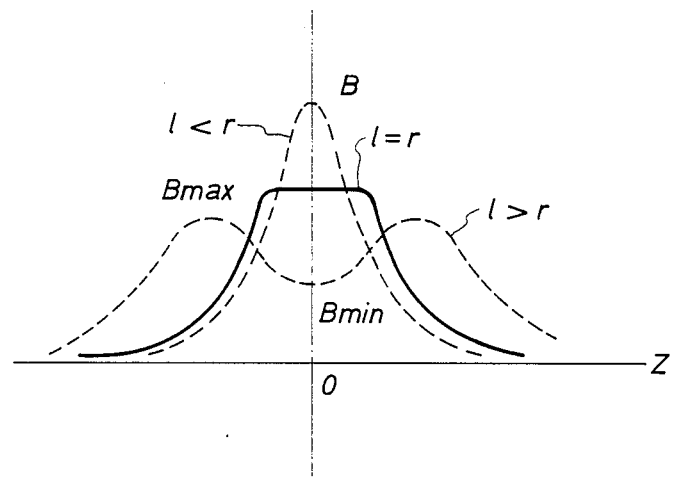
FIG. 3 is a graph showing the intensity of the magnetic field on the Z-axis in FIG. 2.

FIG. 2 is an explanatory view illustrating the relationship between the radius of coils for applying the magnetic field to the molten material and the distance between the opposed coils, in which coils 7 each of an identical shape and having a radius r are opposed while maintaining a distance l and so as to situate at the center thereof on the Z axis. In this case, the intensity of the magnetic field intensity B on the Z-axis is as shown by the graph in the FIG. 3. If r=1, a substantially flat distribution of magnetic field intensity B is obtained near the center 0 for each of the coils 7, while if 1>r, the magnetic field intensity B is decreased near the center 0. While on the other hand, if 1<r, the magnetic field intensity B near the center 0 is at the maximum. In this way, for obtaining a uniform magnetic field intensity B, it is considered desirable to make the radius r of the coils and the distance l between the opposed coils as equal as possible. However, it is usually set as l>r in view of the limit for the arrangement of the coils.

Explanation will now be made to a preferred embodiment of the device for growing single crystals according to this invention.

Figure 4A:
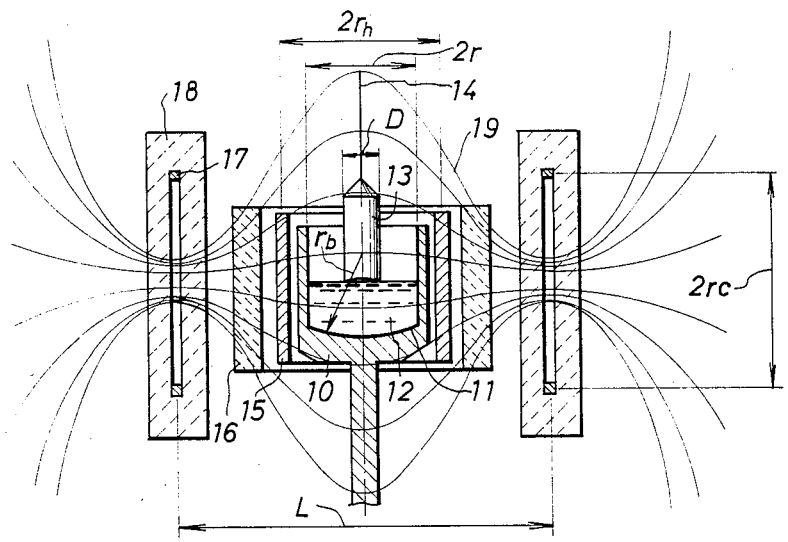
FIG. 4A is a fragmentary vertical cross sectional view for a portion of the device according to this invention showing the magnetic fluxes applied to the molten material.
Figure 4B:
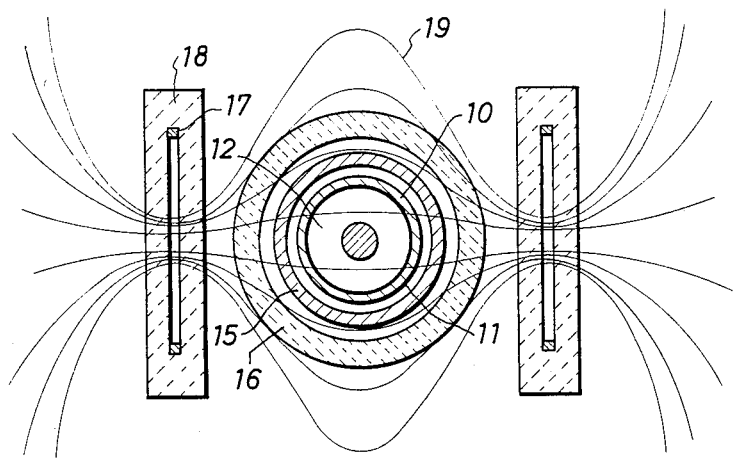
FIG. 4B is a fragmentary transversal cross sectional view of FIG. 4A.

FIGS. 4A and 4B are, respectively, a fragmentary vertical cross sectional view and a fragmentary transversal cross sectional view for a portion of the device according to this invention illustrating the magnetic fluxes applied to the molten material. A crucible 11 of radius r made of quartz glass is inserted into a crucible support 10 made of carbon and molten material 12 is filled in the crucible. At the bottom of the quartz glass crucible 11, the radius of curvature is $r_b$. While on the other hand, a grown silicon single crystal body 13 of diameter D is suspended from a crystal pulling-up wire 14 such that the lower surface of crystals is in contact with the surface of the molten material 12. The crucible 11 is contained within a cylindrical electrical heater 15 of radius $r_h$ and the heater 15 is further contained in a cylindrical temperature keeping member 16 made of carbon. Flat plate-like super-conductive coils 17 are opposed together with lower temperature keeping means 18 at a distance L on both sides of the temperature keeping member 16. The super-conductive coreless coils 17 are suited to get high magnetic field with large size in view of economy, physical size, weight and electric power consumption. Magnetic fluxes 19 from the coils 17 can pass along the outer side of the crucible 11 and also pass along the bottom of the crucible 11 by properly selecting the radius $r_c$ for the coils 17, the bottom radius $r_b$ for the crucible 11 and the distance L between the coils 17. The coils 17 receives a direct electric current.

Referring more specifically to the conditions for the passage of the magnetic fluxes 19 along the outer side and the bottom of the crucible 11, it is necessary that the following relationships are established between the radius of curvature $R_{MF}$ of the magnetic fluxes 19 and the outer diameter r of the crucible 11, as well as between the radius of curvature $R_{MF}$ and the bottom radius $r_b$ of the crucible 11 respectively as:

$r \leq R_{MF} \leq 4r$ $r_b \leq R_{MF} \leq 4r_b$.

For satisfying the foregoing conditions, it is desirable that the radius $r_c$ of the coil 17 is in a relationship:

$r_c = 1.5$ to 5 times r.

While on the other hand, the heating means for the molten material usually comprises an annular carbon member disposed coaxial with the central axis for the crucible at the outer side thereof and the annular heating means is alternately disposed with slits from the upper end and slits from the lower end circumferentially. Accordingly, electrical heating current flows through the heating means in a zig-zag manner along the circumferential direction of the heating means. For avoiding the vibrations of the heater 15 resulted by the interaction between the electrical current and the magnetic field, it is desirable that the ripple value of the heating current of the heater 15 is as small as possible. However, since heating current usually contains from 3 to 5% ripples for a commercial rectifier used in CZ puller, if the coils 17 and the heater 15 are arranged closer to each other in the case where there are fluctuations in the current value within the above-mentioned range, large stresses are exerted repeatingly at a high temperature to the heater 15 due to the excess magnetic field of the coils 17 and the fluctuating current of the heater 15, accordingly, the working life of the heater 15 is shortened. This short working life will be eliminated by using a highly rectified electric current. But the rectifier supplying such a highly rectified electric current is of more high price and large size than a usual rectifier.

As the result of the experiment, if the radius $r_c$ of the coil 17 and the distance L between the coils 17 are selected so as to satisfy:

$r_c > r_h$, and $L > 3r_h$, where $r_h$ represents the radius of the heater 15, $r_c$ represents the radius of the coil 17 and L represents the distance between the opposed coils 17, the times capable of using the heater 15 at 4% ripple value of the heating current can be increased by from 20 to 30% as compared with the case:

$r_c > 0.8r_h$ or $r_c \leq r_h$, or $L \leq 3r_h$.

By the way, for stably pulling-up the single crystals in a state where the magnetic field is applied to the molten material, it is desirable that there is the relationship: $D/2r < 0.75$ between the diameter D for the single crystals 13 and the diameter 2r for the crucible 11 and it has further been found from the result of the experiment that the oxygen density in the grown single crystals 13 has a concern with the value D/2r.

That is, in a state where a magnetic field at 3000 gauss is applied to the molten material 12, the oxygen density of single crystals can be reduced easily to less than $10 \times 10^{17}$ atoms/cm$^3$ if $D/2r < 0.7$ and to less than $5 \times 10^{17}$ atoms/cm$^3$ if $D/2r < 0.6$. It is preferable that $D/2r < 0.5$ and the oxygen density can be as low as $1 \times 10^{17}$ atoms/cm$^3$ in this case. However, the diameter D of the single crystals 13 is greater than 100 mm$\phi$ in the foregoing experiment.

Figure 5:
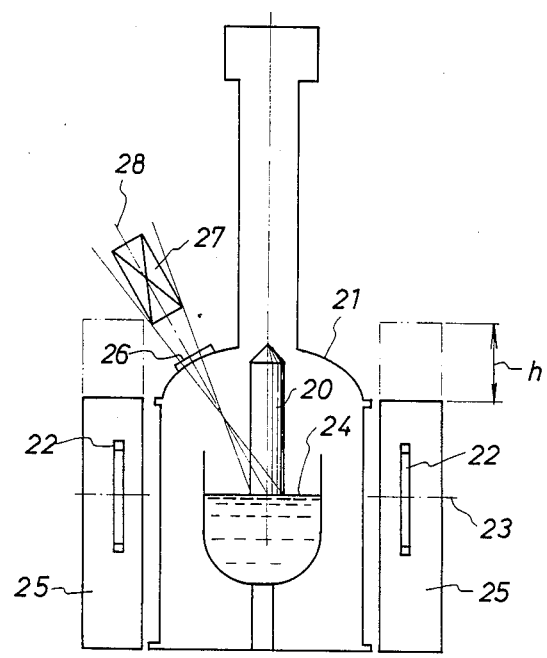
FIG. 5 is a schematic view showing the limit for the height of the low temperature retaining means.

FIG. 5 is an explanatory view illustrating the limit for the height of the low temperature retaining means, in which pulled-up crystals 20 are disposed within a pulling-up chamber 21. The central line 23 for coils 22 substantially coincides with the liquid surface 24 of the molten material. If the diameter of the coils 22 is increased in the low temperature retaining means 25, the outer diameter and the height for the cylindrical low temperature retaining means 25 having a vertical axis for opposed flat-plate superconductive coils are increased. In the experimental device equipped with the cylindrical low temperature retaining means, it is desirable that the height for the low temperature retaining means is higher by 300 mm than a height for the upper end of the coils, as well as that the inner diameter of the low temperature retaining means is smaller at least by 100 mm than the distance L between the coils and that the outer diameter of the means is set to a value greater than: $\sqrt{r_c^2 + L^2/4} + 100$ mm.

Further, in view of the operation of the device, large-scaled low temperature retaining means is not favorable and it is desirably limited to such a height that a measuring wind 26 functions satisfactorily. That is, the outer size of measuring means 27 for optically measuring the diameter of the single crystals 20 is about 10 cm×30 cm or about 7 cmφ×10 cm. For visually observing the pulled-up single crystals 20, the retaining position for the measuring means 27 has to be situated on a line 28 connecting the center of the boundary of the single crystals with the center for the measuring wind 26, and the upper limit for the height is 200 mm above the flange of the pulling-up chamber 20. Accordingly, the limit for the height of the low temperature retaining means 25 is less than 200 mm for h in FIG. 5. Within this range, there are no troubles for the mounting of the low temperature retaining means 25 and the operation for the measuring means 27.

It is of course possible to make various modifications for the shape of the low temperature retaining means 25. For instance, by using a separatable type low temperature retaining means, the foregoing restriction can be moderated. Further, the outer shape of the low temperature retaining means may be cylindrical, or may be cylindrical in the inside and square post-like at the outer side. In this case, one example for the dimension and the weight of the low temperature retaining means for use with a crucible of maximum 450 mm diameter, the inner cylinder diameter was 900 mm, the outer square post size was 1350 mm (width)×1460 mm (lateral size)×1135 mm (height), and the total weight was 2.6 t.

FIG. 6A is an explanatory view for the device of growing single crystals equipped with an elevatable low temperature retaining means, in which a low temperature retaining means 32 is disposed opposing to pulling-up chamber 31. Upon replacing hot zone constituent parts such as heaters, upon replacing crucibles, upon mounting polycrystalline silicon and upon maintenance such as cleaning for the inside of the chamber, the low temperature retaining means 32 can be downwarded to below the pulling-up chamber 31 to improve the handlability upon maintenance. Further, the pulling-up chamber 31 is supported on a rotational support post 33 and a rotational support arm 34, in which the pulling-up chamber 31 is rotated around the rotation post 33 to expose the hot zone constituent parts 35 thereby improve the operationability upon foregoing maintenance.

What is claimed is:

1. A device for growing a single crystal comprising:
    a circular cylindrical crucible having a bottom of a spherical segment,
    an annular heating means disposed coaxially with a longitudinal axis of said crucible and surrounding said crucible for heating and melting an electroconductive substance filled in said crucible, said heating means being alternatively provided with first slits from one end thereof and second slits from the other end thereof along a circumference thereof,
    means for pulling up said single crystal from said molten substance, and
    a pair of circle electromagnetic coils from applying one-way axially symmetric magnetic field to said substance, disposed outside said heating means and opposed to each other in a symmetry with respect to said longitudinal axis, situated substantially at the same height at central axes thereof as an upper surface of said molten substance, wherein a height of said coil is greater than 0.8 times of a diameter of said heating means and a distance between said coils is greater than 1.5 times of said diameter of said heating means, an effective average radius of said coil being from 1.5 to 5 times of a radius of said crucible,
    whereby, magnetic fluxes of said axially symmetric magnetic field are arranged in such a manner that all other said magnetic fluxes except a central flux passing through a rotational axis of said axially symmetric magnetic field are swelled, wherein said rotational axis substantially passes through said upper surface, said magnetic fluxes include both side lateral fluxes each passing through a circumferential side portion of said crucible at the furthest apart portion from said rotational axis and at a level of said upper surface, each of said both side lateral fluxes at said side portion having a substantially same curvature as that of said side portion, wherein said magnetic fluxes also include a lower flux passing through the lowest portion of said bottom, said lower flux at said lowest portion having a substantially same curvature as that of said lowest portion.

2. A device according to claim 1, in which said substance comprises a polycrystalline silicon.

3. A device according to claim 1, in which said coils comprise superconductive coils.

4. A device according to claim 2, in which said coils comprise superconductive coils.

* * * * *